United States Patent
Mutnury et al.

(10) Patent No.: US 11,144,410 B2
(45) Date of Patent: Oct. 12, 2021

(54) SYSTEM AND METHOD TO DYNAMICALLY INCREASE MEMORY CHANNEL ROBUSTNESS AT HIGH TRANSFER RATES

(71) Applicant: DELL PRODUCTS, L.P., Round Rock, TX (US)

(72) Inventors: Bhyrav M. Mutnury, Round Rock, TX (US); Stuart Allen Berke, Austin, TX (US); Vadhiraj Sankaranarayanan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/874,380

(22) Filed: May 14, 2020

(65) Prior Publication Data

US 2020/0272545 A1  Aug. 27, 2020

Related U.S. Application Data

(63) Continuation of application No. 15/876,866, filed on Jan. 22, 2018, now Pat. No. 10,657,009.

(51) Int. Cl.
| | |
|---|---|
| *G01R 31/28* | (2006.01) |
| *G06F 11/14* | (2006.01) |
| *G06F 3/06* | (2006.01) |
| *G06F 11/10* | (2006.01) |
| *G06F 11/07* | (2006.01) |

(52) U.S. Cl.
CPC ........ *G06F 11/1471* (2013.01); *G06F 3/0614* (2013.01); *G06F 11/073* (2013.01); *G06F 11/0778* (2013.01); *G06F 11/1048* (2013.01); *G06F 11/1056* (2013.01)

(58) Field of Classification Search
CPC . G06F 11/1471; G06F 11/1056; G06F 3/0614
See application file for complete search history.

(56) References Cited

U.S. PATENT DOCUMENTS

| | | | |
|---|---|---|---|
| 8,595,597 B2 | 11/2013 | Xie et al. | |
| 2008/0112233 A1* | 5/2008 | Woo | G11C 7/1057 365/189.05 |
| 2011/0316580 A1 | 12/2011 | McCall et al. | |
| 2014/0195730 A1 | 7/2014 | Feekes | |
| 2017/0178750 A1 | 1/2017 | Kang et al. | |

* cited by examiner

*Primary Examiner* — Samir W Rizk
(74) *Attorney, Agent, or Firm* — Larson Newman, LLP

(57) ABSTRACT

A dynamic random access memory (DRAM) device includes an on-die termination (ODT) controller including an input to receive an ODT signal from a memory controller, and ODT circuitry to terminate an interface circuit, the interface circuit to provide a data signal between the memory controller and the DRAM device. The ODT controller is configured in a first impedance switching mode to terminate the interface circuit at a first impedance level in response to a first state of the ODT signal, to terminate the interface circuit at a second impedance level in response to a second state of the ODT signal, and to terminate the interface circuit at a third impedance level in response to a change in the ODT signal from the first state to the second state, the third impedance level being between the first impedance level and the second impedance level.

20 Claims, 5 Drawing Sheets

SYSTEM AND METHOD TO DYNAMICALLY INCREASE MEMORY CHANNEL ROBUSTNESS AT HIGH TRANSFER RATES

CROSS-REFERENCE TO RELATED APPLICATION

This application is a Continuation of U.S. patent application Ser. No. 15/876,866 entitled "System and Method to Dynamically Increase Memory Channel Robustness at High Transfer Rates," filed on Jan. 22, 2018, the disclosure of which is hereby expressly incorporated by reference in its entirety.

FIELD OF THE DISCLOSURE

This disclosure generally relates to information handling systems, and more particularly relates to dynamically increasing memory channel robustness at high transfer rates.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A dynamic random access memory (DRAM) device may include an on-die termination (ODT) controller including an input to receive an ODT signal from a memory controller, and ODT circuitry to terminate an interface circuit, the interface circuit to provide a data signal between the memory controller and the DRAM device. The ODT controller may be configured in a first impedance switching mode to terminate the interface circuit at a first impedance level in response to a first state of the ODT signal, to terminate the interface circuit at a second impedance level in response to a second state of the ODT signal, and to terminate the interface circuit at a third impedance level in response to a change in the ODT signal from the first state to the second state.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
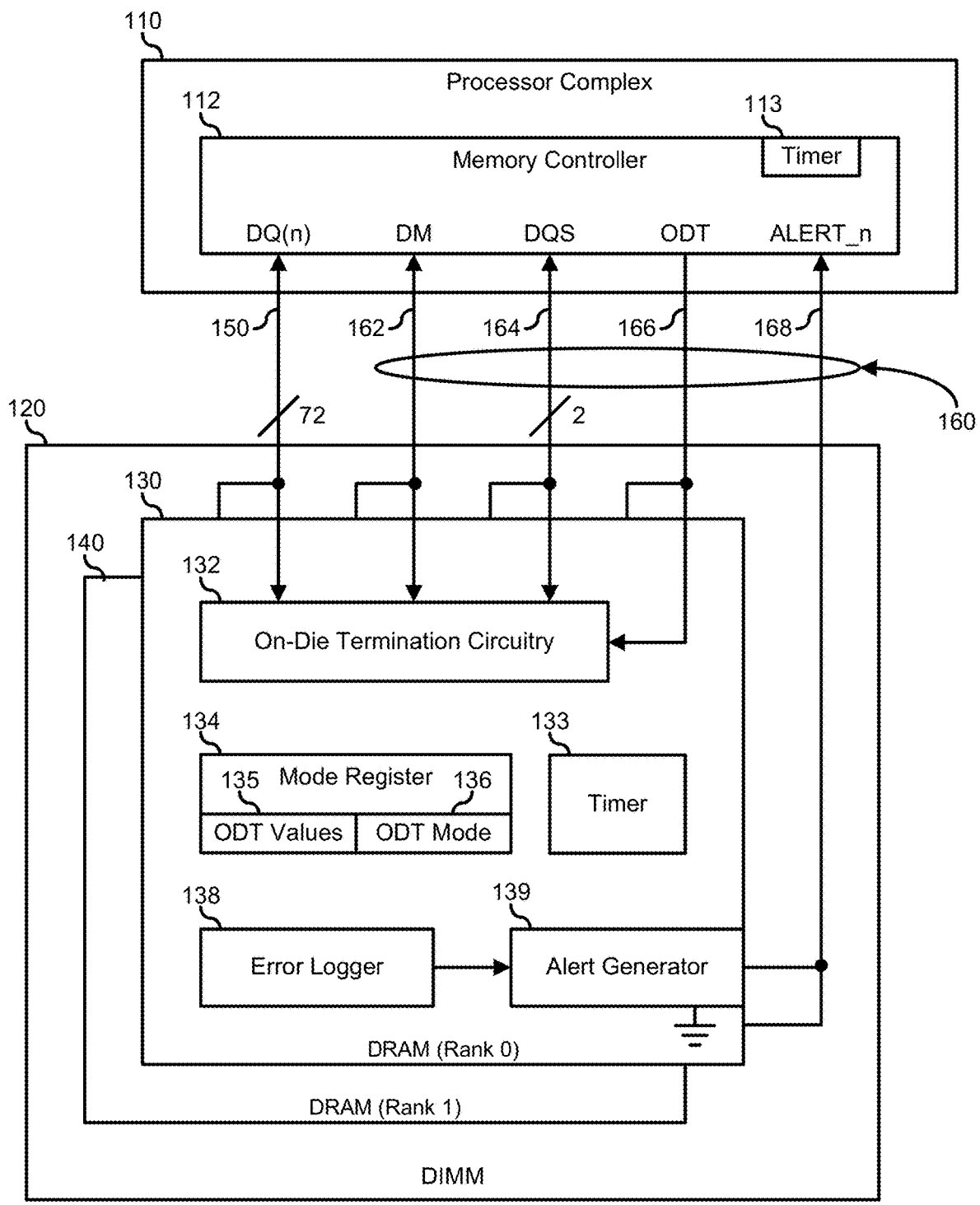
FIG. 1 is a block diagram illustrating an information handling system according to an embodiment of the present disclosure.

FIG. 1 illustrates an information handling system 100 including a processor complex 110 and a dual in-line memory module (DIMM) 120. Processor complex 110 operates to provide the data processing functionality of information handling system 100, such as is typically associated with an information handling system. As such, processor complex 110 represents a data processing apparatus, such as one or more central processing units (CPUs) or processor cores, and the associated data input and output I/O functionality, such as a chipset component, and other I/O processor components. Processor complex 110 operates to execute machine-executable code to perform the data processing tasks associated with information handling system 100.

Processor complex 110 includes a memory controller 112 that represents a portion of the processor complex that is dedicated to the management of data storage and retrieval operations from the memory devices of information handling system 100, and the information handling system may include one or more additional memory controllers similar to memory controller 112, as needed or desired. Memory controller 112 may reside on a system printed circuit board of information handling system 100, may be integrated into an I/O processor component of the information handling system, may be integrated with processor complex 110, may form a portion of a system-on-a-chip (SoC) which implements the information handling system, or may be implemented in another way, as needed or desired.

Memory controller 112 includes a timer 113 and is configured to provide a channel to one or more DIMM, such as DIMM 120 in accordance with a particular memory architecture. As such, DIMM 120 represents a memory device of information handling system 100 that is packaged as a DIMM in accordance with the particular memory architecture by which memory controller 112 operates. For example, memory controller 112 and DIMM 120 may operate in accordance with a Double-Data Rate (DDR) standard, such as a JEDEC DDR4 or DDR5 standard. It will be understood that, where memory controller 112 and DIMM 120 operate in accordance with the DDR5 standard, then the memory controller will be configured to provide two channels to the one or more DIMM, and that DIMM 120 will include functions and features appropriate to the implementation of the dual-channel architecture of the DDR5 standard. As such, it will be further understood that the functions and features as described herein may need to be duplicated on each memory channel of the dual-channel architecture, as needed to fully implement the present invention on a DDR5 memory controller and on DDR5 DIMMs.

The channel between memory controller 112 and DIMM 120 includes a data interface 150 and a control interface 160. Data and control interfaces 150 and 160 represent a number of circuit traces that are each configured to carry a particular data or control signal between memory controller 112 and DIMM 120, and are implemented as circuit traces on a printed circuit board of information handling system 100, or as other connections between the memory controller and the DIMM, as needed or desired. In particular, in accordance with the particular memory architecture, the circuit traces that make up data and control interfaces 150 and 160 can each be implemented as single-ended multi-drop circuits, and my exhibit various specified electrical characteristics, such as set-up and hold timings, voltage levels, impedances, and the like. Moreover, as viewed from DIMM 120, the circuit traces may represent inputs, outputs, or both, as needed or desired.

In particular, data interface 150 represents a number of circuit traces that are configured to provide data transmission in association with various memory transactions (memory reads or memory writes) between memory controller 112 and DIMM 120. In a particular embodiment, where DIMM 120 represents a DDR4 DIMM, data interface 150 represent 72 individual circuit traces, including 64 connections each for transmitting one bit of data, and eight (8) bits of Error Checking and Correcting information associated with the 64-bits of data between memory controller 112 and DIMM 120. As such, data interface 150 is shown as representing 72 circuit traces between memory controller 112 and DIMM 120. It will be understood that, where DIMM 120 represents a DDR5 DIMM, data interface 150 will represent two separate memory channels, each having 32 connections for transmitting one bit of date and with four (4) bits of ECC information. Further, other data widths may be utilized for data and ECC information, as needed or desired. Moreover, it will be understood that a particular memory transaction will be targeted to the memory devices on a particular rank of a particular DIMM, and that the memory devices of other ranks of memory devices will not be targeted by the particular memory transaction. As such, each circuit trace of data interface 150 represents a bi-directional, single-ended, multi-drop circuit trace that needs to be terminated in a different impedance in the memory devices, depending on whether or not a particular memory device is the target of the memory transaction and whether the memory transaction is a memory read or a memory write.

Control interface 160 includes a data mask (DM) circuit trace 162, a pair of data strobe (DQS) circuit traces 164, an on-die termination (ODT) circuit trace 166, and an alert (ALERT_n) circuit trace 168. DM circuit trace 162 and DQS circuit traces 164 will be understood to be targeted by a particular memory transaction to the memory devices on a particular rank of a particular DIMM, and that the memory devices of other ranks of memory devices will not be targeted by the particular memory transaction. As such, DM circuit trace 162 and DQS circuit traces 164 represent bi-directional, single-ended, multi-drop circuit traces that need to be terminated in different impedances in the memory devices, depending on whether or not a particular memory device is the target of the memory transaction and whether the memory transaction is a memory read or a memory write. ODT circuit trace 166 will be understood to be an input receive by all memory devices on all DIMMs on the channel, and as such may have a fixed termination impedance in each memory device that is independent of which memory device is targeted or whether a memory transaction is a memory read or a memory write. ALERT_n circuit trace 168 will be understood to be an output generated by one or more memory device on DIMM 120 as an output to memory controller 112, and can be generated as a wired-or configuration, as needed or desired. Control interface 160 will be understood to include additional circuit traces for carrying other control signals between memory controller 112 and DIMM 120, as needed or desired.

The normal functions and features of the circuit traces of data interface 150 and control interface 160 will be understood within the context of the particular memory architecture implemented on information handling system 100, and so the normal functions and features of the interface circuit traces will not be further described herein, except as needed to describe the features of the present disclosure. As used hereinafter, references to the various circuit traces of data interface 150 and control interface 160 shall be referred to by only the associated signal name. For example, ODT circuit trace 168 shall henceforth be referred to as only ODT 168, etc.

DIMM 120 includes a dynamic random access memory (DRAM) device 130 in a first rank (rank 0) of the DIMM, and a DRAM device 140 in a second rank (rank 1) of the DIMM. DRAM device 130 and DRAM 140 are similar DRAM devices, and the functions and features described herein with respect to one of DRAM devices 130 and 140 should be understood to be ascribed to the other DRAM device unless specifically noted herein. As such, the functions and features of DRAM devices 130 and 140 will be described with respect to DRAM device 130, and should be understood to also be applicable to DRAM device 140. DRAM devices 130 and 140 may represent one or more DRAM devices. It will be understood that a particular DIMM may have a different number of ranks of DRAM devices, such as a single rank DIMM, up to 16 or more ranks per DIMM. It should therefore be understood that the teachings of the present disclosure are applicable for DIMMs with any number of ranks. In particular, an information handling system may includes two DIMM slots, each populated with single-rank DIMMs that each incorporate the teachings of the present disclosure.

DRAM device 130 includes ODT circuitry 132, a timer 133, one or more mode registers 134, an error logger 138, and an alert generator 139. ODT circuitry 132 operates to provide different termination impedances for the bi-directional, single-ended, multi-drop circuit traces of data interface 150 (referred to hereinafter as DQ 150) and control interface 160 (DM 162, and DQS 164), based upon whether or not a particular memory transaction is targeted to DIMM 130 and whether or not the memory transaction is a memory read or a memory write. In particular, ODT circuitry 132 provides for three states of termination for each of three different memory transaction modes. Each state is associated with a different termination impedance. The states are determined based upon the state of ODT 166, and whether DRAM 130 is the target of a memory write transaction. In a particular embodiment, ODT circuitry 132 provides for Here, when no memory transaction is being processed, memory controller 112 deasserts ODT 166, which places ODT circuitry 132 in a first state, called PARK, and DQ 150, DM 162, and DQS 164 are terminated with an impedance associated with the PARK state, called ODT_park. The impedance level of ODT-park is selected to provide low power consumption on DQ 150, DM 162, and DQS 164 when no memory transactions are being processed, and the PARK state is typically associated with a high-impedance level for ODT_park. Then, when a memory transaction (either a memory read or a memory write) is processed, memory controller 112 asserts ODT 166. When ODT is asserted, DRAM 130 makes a further determination as to whether or not the memory transaction is a memory write to itself. If the memory transaction is not a memory write to DRAM 130, that is, when the memory transaction is a memory read transaction or is a memory write transaction to DRAM 140 or to another DIMM, ODT 132 enters a second state, called NOMINAL, and DQ 150, DM 162, and DQS 164 are terminated with an impedance associated with the NOMINAL state, called ODT_nom. The impedance level of ODT-nom is selected to provide minimum signal reflection on DQ 150, DM 162, and DQS 164, so as to improve the signal integrity of the associated signals, and the NOMINAL state is typically associated with an impedance level that matches the impedance of the transmission lines associated with the circuit traces at the non-targeted device. When the memory transaction is a memory write to DRAM 130, ODT 132 enters a third state, called WRITE, and DQ 150, DM 162, and DQS 164 are terminated with an impedance associated with the WRITE state, called ODT_write. The impedance level of ODT_write is selected to provide maximum signal transmission on DQ 150, DM 162, and DQS 164 to DRAM 130, so as to improve the signal integrity of the associated signals at the targeted device, and the WRITE state is typically associated with an impedance level that transmits the most signal power to the targeted device.

Mode registers 134 include various ODT value settings 135, and an ODT mode setting 136. Mode registers 134 operate to provide various configuration settings for the operation of DRAM 130 which can be set up via transactions on data interface 150 and control interface 160, via a Serial Presence Interface (SPI) of DIMM 120, or by another mechanism, as needed or required. In some instances, the settings of mode registers 134 are configured at boot time for information handling system 100, and in other instances, the settings can be dynamically changed during operation of the information handling system. Typically, ODT value settings 135 are configured to enable or disable the ODT states and to set the impedance levels for the ODT states. In a particular embodiment, the impedance levels are set as a fraction of a particular default impedance level. For example, where the default impedance level, called RZQ, is 240 ohms, ODR_nom can be set to RZQ, RZQ/2, RZQ/3, RZQ/4, RZQ/5, RZQ/6, or RZQ/7. It will be understood that ODT value settings 135 will be configurable based upon the particular memory architecture implemented on information handling system 100, and so the ODT value settings will not be further described herein, except as needed to describe the features of the present disclosure.

Figure 2:
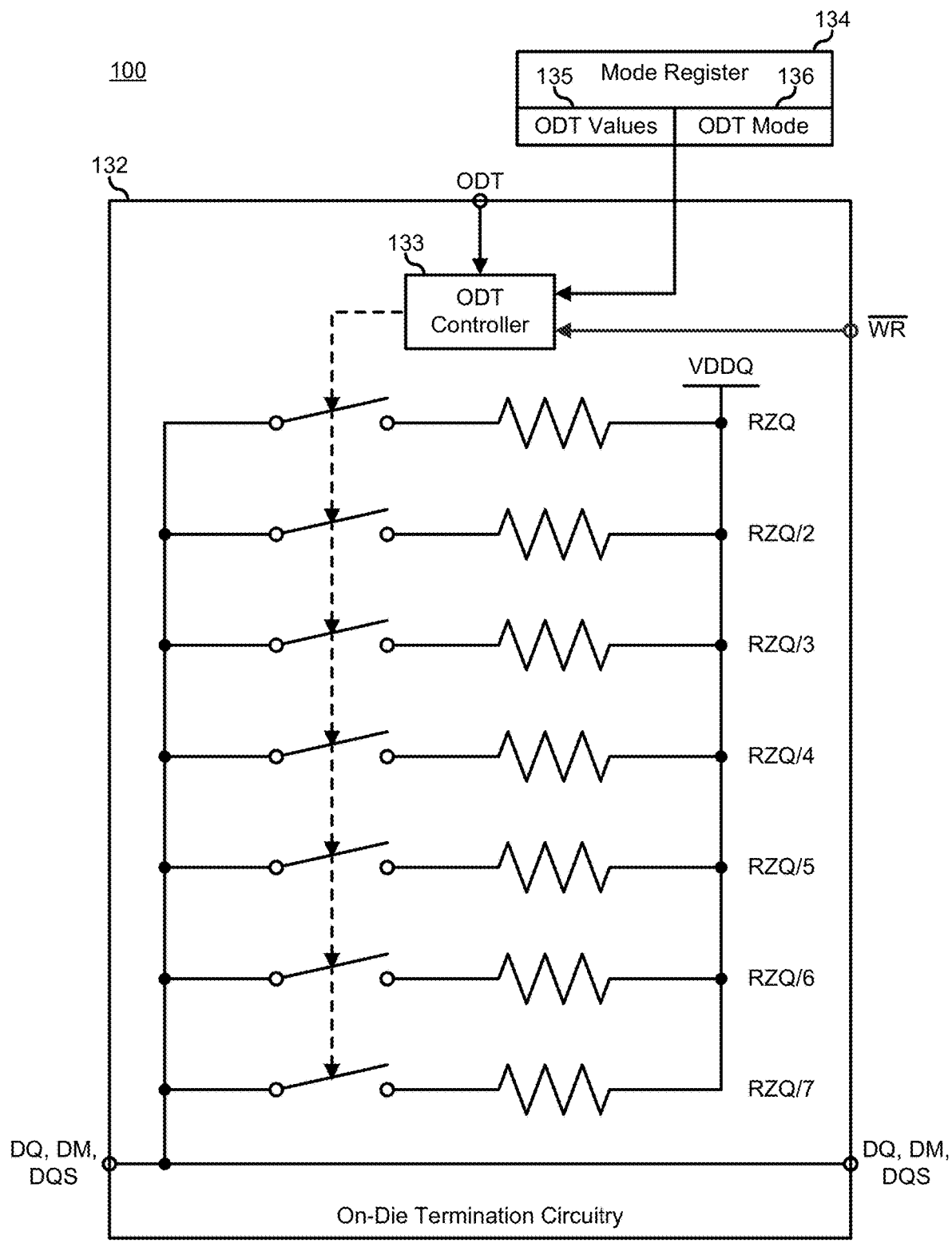
FIG. 2 is a block diagram of an On-Die Termination (ODT) circuitry of the information handling system of FIG. 1.

FIG. 2 illustrates DRAM device 100 with additional details of ODT circuitry 132. ODT circuitry 132 illustrates the termination circuit for a single circuit trace, such as one bit of the DQ data, the DM signal, or one side of the DQS signal. ODT circuitry 132 includes an ODT controller 133 that selects one or more resistance to switch in to the circuit trace to terminate the circuit trace to a high voltage level, VDDQ. ODT controller 133 receives the ODT signal input and the WRITE signal input, WR, and, based upon the contents of mode registers 136, determines which resistances to switch into the circuit trace. For example, the RZQ switched resistance may be selected for the PARK mode, and where RZQ is equal to 240 ohms, then the ODT_park impedance level will be equal to 240 ohms. Further, the RZQ switched resistance and the RZQ/2 switched resistance may be selected for the WRITE mode, such that the ODT_write impedance level will be equal to 120 ohms. Finally, the RZQ switched resistance, the RZQ/2 switched resistance, the RZQ/3 switched resistance, and the RZQ/4 switched resistance may be selected for the NOMINAL mode, such that the ODT_nom impedance level will be equal to 60 ohms.

Thus, when DRAM device 200 experiences transitions in the termination mode, the circuit trace will see changing impedance levels due to the switching on and off of the various switched resistances, in addition to the switching on and off of the switched resistances in other DRAM devices or DIMMs on the memory channel.

When the ODT signal is asserted for back-to-back memory operations, the impedances on the various circuit traces of DQ, DM, and DQS may exhibit glitches due to the timing windows associated with the changes in the impedance states. In particular, when different ranks within a DIMM or different DIMMs on the channel are targeted for consecutive memory transactions, the variation in the actual timing behavior of the DRAM devices may lead to different impedances being switched onto the circuit traces at different times. As the speed of memory architectures is increasing, from 3.2 giga-transfers per second (GTS) with DDR4 and early DDR5 architectures to 6.4 GTS for later DDR5 architectures, the existence of such glitches is becoming increasingly critical to the performance of the memory architectures, and the number of correctable and uncorrectable errors is likewise increasing. Note that a typical DIMM has two receiver configurations: targeted RX and non-targeted RXs. In general, ODT is utilized in DIMMs to minimize reflection on the channel so that the targeted RX receives the signal with the maximum noise margin. As such, ODT reduces the amount of jitter at the module being accessed and decreases reflections from any secondary modules. This improvement in signal integrity ensures a more predictable, open data eye.

Figure 3:
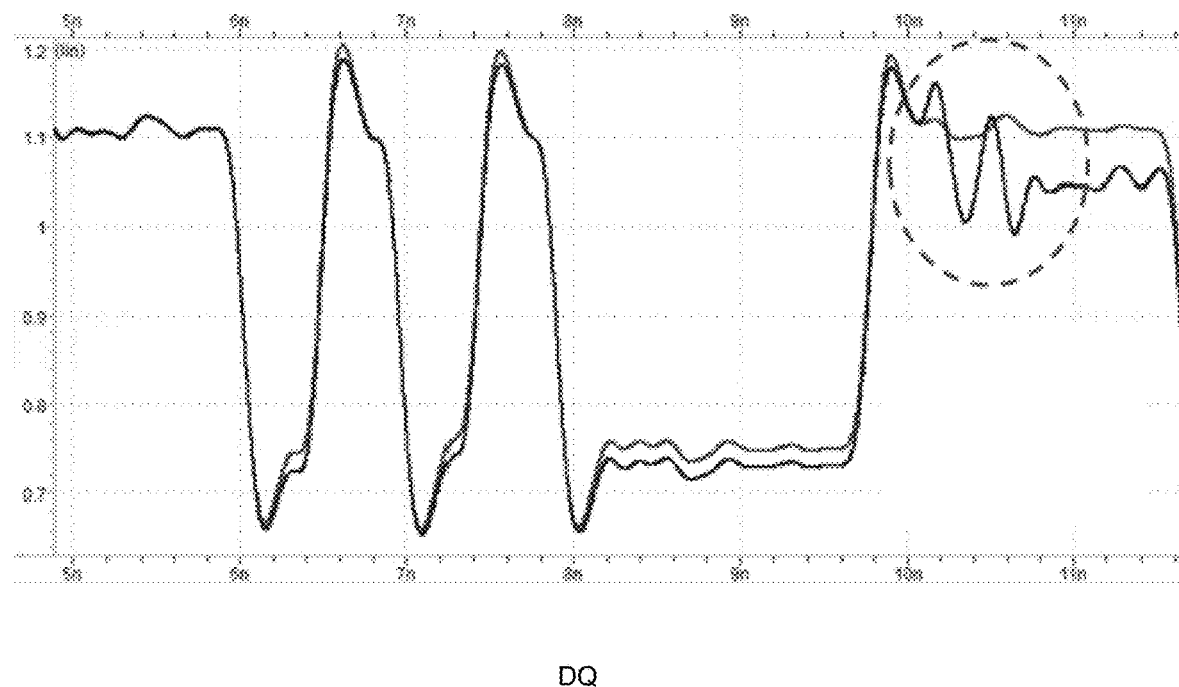
FIG. 3 is a sample of data on a bi-directional, multi-drop, single-ended circuit trace according to an embodiment of the present disclosure.

FIG. 3 illustrates an exemplary sample measuring the voltage on a data line DQ where back-to-back memory writes are performed on different ranks within a DIMM, or on DRAM devices on different DIMMS. The flatter trace on the right side of the sample represents a clean impedance transition on the devices on the circuit trace. The oscillating trace on the right side of the sample represents a distorted impedance transition on the devices of on the circuit trace. Such oscillations may be spuriously detected as data state transitions, and thus may lead to correctable or uncorrectable errors on the DIMM.

Returning to FIGS. 1 and 2, the operation of ODT mode setting 136 can now be described. In order to reduce the effects of glitches on the various circuit traces of DQ, DM, and DQS due to the changes in impedance levels, DRAM 130 operates to change the ODT impedance levels in two different modes, as selected by the contents of ODT mode setting 136. In a normal impedance switching mode, ODT mode setting 136 is in a first state, and ODT circuitry 132 operates to directly switch between the switched impedances of the initial ODT mode and the subsequent ODT mode. For example, if ODT_park is implemented by switching in the RZQ switched impedance (240 ohms), and ODT_write is implemented by switching in the RZQ/7 switched impedances (34 ohms), that is, by switching all switched impedances into the circuit trace, then ODT controller 133 implements a transition from PARK to WRITE by simultaneously switching all of the RZQ/7 switched impedances into the circuit trace.

On the other hand, in a dynamic impedance switching mode, ODT mode setting 136 is in a second state, and ODT circuitry 132 operates to switch between the switched impedances of the initial ODT mode and the subsequent ODT mode in two or more steps. Hence, continuing the example from above, ODT controller 133 can implement a transition from PARK to WRITE by first switching to an intermediate termination impedance, such as RZQ/2, RZQ/3, RZQ/4, RZQ/5, or RZQ/6, and then, at a later time switching the rest of the RZQ/7 switched impedances into the circuit trace. Here, it will be understood that the transition from the initial ODT state to the subsequent ODT state will still be completed within the timing constraints dictated by the particular memory architecture, but that the intermediate impedance level steps will be performed within the time window dictated for ODT state transitions. In a particular embodiment, the time window for ODT state transitions is evenly divided by the number of steps, and each step is performed in accordance with the time division of the time window. For example, if the ODT impedance change is performed in two steps, the intermediate impedance level can be switched into the circuit trace at a time that is half way through the time window. In another embodiment, other timings may be utilized as needed or desired. For example, it may be advantageous to the reduction of transition noise on the circuit traces to perform the intermediate impedance level switch closer to the beginning of the time window or closer to the end of the time window.

In a particular embodiment, information handling system 100 sets ODT mode setting 136 into the second state, the dynamic impedance switching mode, at the time information handling system 100 is booted, and the information handling system remains in the dynamic impedance switching mode for the duration of operations of the information handling system within that particular boot cycle. In another embodiment, information handling system 100 switches ODT mode setting 136 between the first state, the normal impedance switching mode, and the second state, the dynamic impedance switching mode, as needed based upon the performance of the channel.

Error logger 138 operates to detect correctable and uncorrectable errors that occur on data interface 150 and control interface 160. In particular, DRAM 130 is configured to detect errors on data interface 150 using the ECC information to detect when invalid data patterns have been received. When a correctable data error is detected, DRAM 130 corrects the data and provides an indication to error logger 138, which maintains a count of the correctable errors. If the count of the correctable errors exceeds a threshold, then error logger 138 provides an indication to alert generator 139 which pulls ALERT_n 168 low. When memory controller 112 detects that ALERT_n 168 has been pulled low, then the memory controller sets ODT mode setting 136 into the second state, the dynamic impedance switching mode. Also, when DRAM 130 detects an uncorrectable data error, the DRAM provides an indication to error logger 138. Here, error logger 138 provides an indication to alert generator 139 when an uncorrectable error is detected, and memory controller 112 sets ODT mode setting 136 into the second state, the dynamic impedance switching mode.

When memory controller 112 has set ODT mode setting 136 into the second state, the dynamic impedance switching mode, in response to detecting that ALERT_n 168 has been pulled low, then the memory controller maintains timer 113 for maintaining DRAM 130 in the dynamic impedance switching mode. If timer 113 times out, then memory controller 112 resets ODT mode setting 136 to the first state, the normal impedance switching mode until such time that new errors occur. Note that memory controller 112 can also place DIMM 130 into the dynamic impedance switching mode in response to errors detected on DIMM 140, as needed or required.

In a particular embodiment, DRAM device 130 operates to automatically switch to the dynamic impedance switching mode when the count of correctable errors exceeds the threshold or when an uncorrectable error is detected. Further, in a particular embodiment, DRAM device 130 maintains timer 133 for maintaining the DRAM device in the dynamic impedance switching mode. Then, if timer 133 times out, DRAM device 130 resets to the first state, the normal impedance switching mode until such time that new errors occur.

Figure 4:
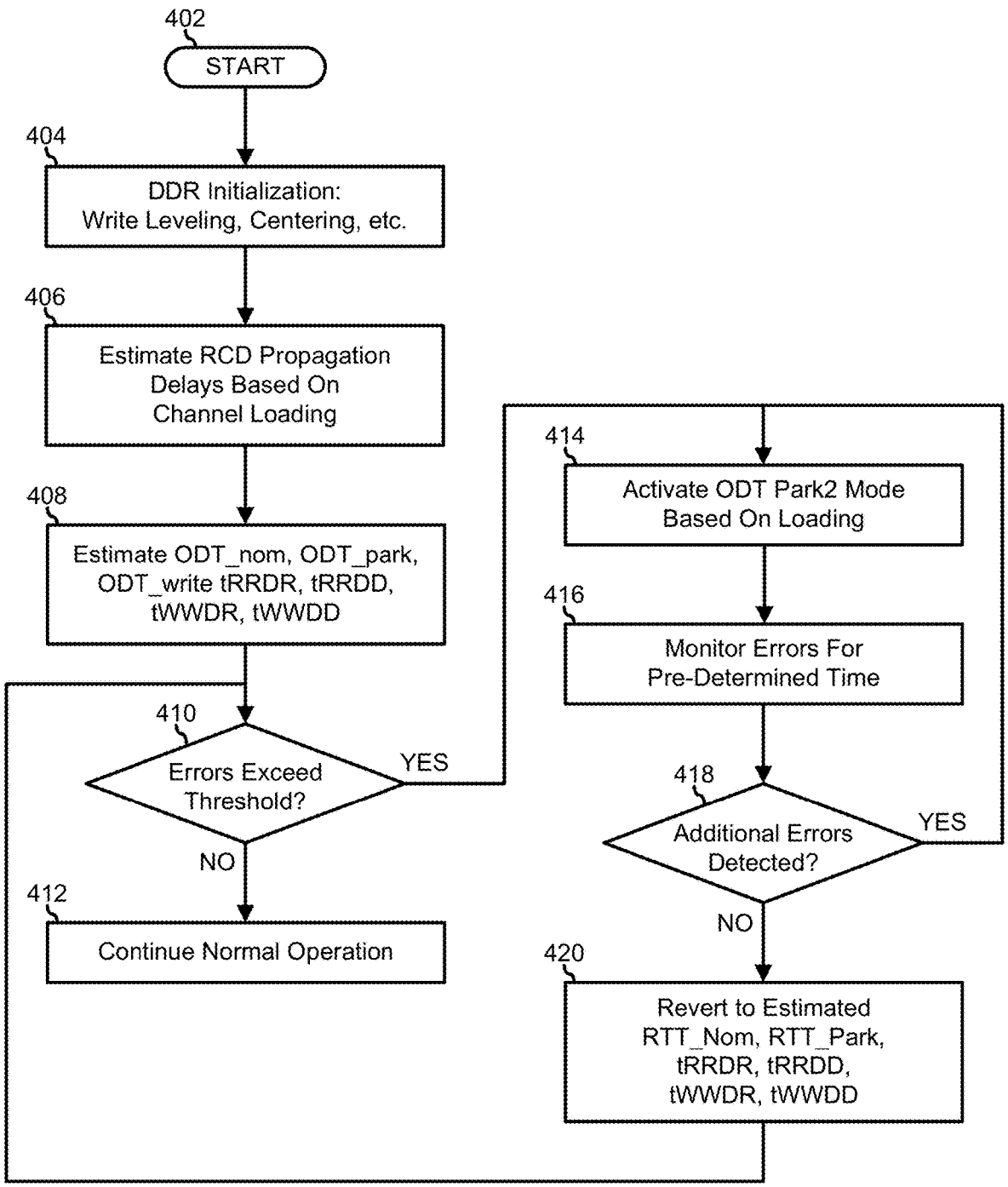
FIG. 4 illustrates a method to dynamically increase memory channel robustness at high transfer rates according to an embodiment of the present disclosure.

FIG. 4 illustrates a method to dynamically increase memory channel robustness at high transfer rates, beginning at block 402. A memory controller of an information handling system initializes a memory channel, including performing write leveling, voltage centering, and the like, in block 404. The memory controller estimates Register Clock Delays, such as propagation delays, based upon the DIMM and rank loading of the memory channel in block 406. The memory controller continues the memory channel initialization by estimating values for ODT_nom, ODT_park, ODT_write, delay time for back-to-back reads between a DIMM and a different rank (tRRDR), delay time for back-to-back reads between a DIMM and a different DIMM (tRRDD), delay time for back-to-back writes between a DIMM and a different rank (tWWDR), and delay time for back-to-back writes between a DIMM and a different DIMM (tWWDD) in block 408.

Once the memory channel is initialized, the memory controller begins normal operation on the memory channel. A decision is made as to whether or not a DRAM has detected correctable errors in excess of a threshold or has detected uncorrectable errors, and has asserted the ALERT_n signal to the memory controller in decision block 410. If not, the "NO" branch of decision block 410 is taken, normal operations continue in block 412, and the method returns to decision block 410 until correctable errors in excess of the threshold or uncorrectable errors have been detected. If a DRAM has detected correctable errors in excess of a threshold or has detected uncorrectable errors, and has asserted the ALERT_n signal to the memory controller, the "YES" branch of decision block 410 is taken and the memory controller activates the dynamic impedance switching mode on the impacted DIMM or rank in block 414.

The memory controller monitors the impacted DIMM for a pre-determined time in block 416, and a decision is made as to whether or not the impacted DRAM has detected additional correctable errors in excess of a threshold or has detected additional uncorrectable errors, and has reasserted the ALERT_n signal to the memory controller within the pre-determined time in decision block 418. If not, the "YES" branch of decision block 418 is taken and the method returns to block 416 where the memory controller monitors the impacted DIMM for a reset pre-determined time. If memory controller monitors the impacted DIMM for a pre-determined time the impacted DRAM has not detected additional correctable errors in excess of the threshold and has not detected additional uncorrectable errors, and has not asserted the ALERT_n signal to the memory controller within the pre-determined time, the "NO" branch of decision block 418 is taken, the memory controller deactivates the dynamic impedance switching mode on the impacted DIMM or rank in block 420, and returns to decision block 410 until correctable errors in excess of the threshold or uncorrectable errors have been detected.

Figure 5:
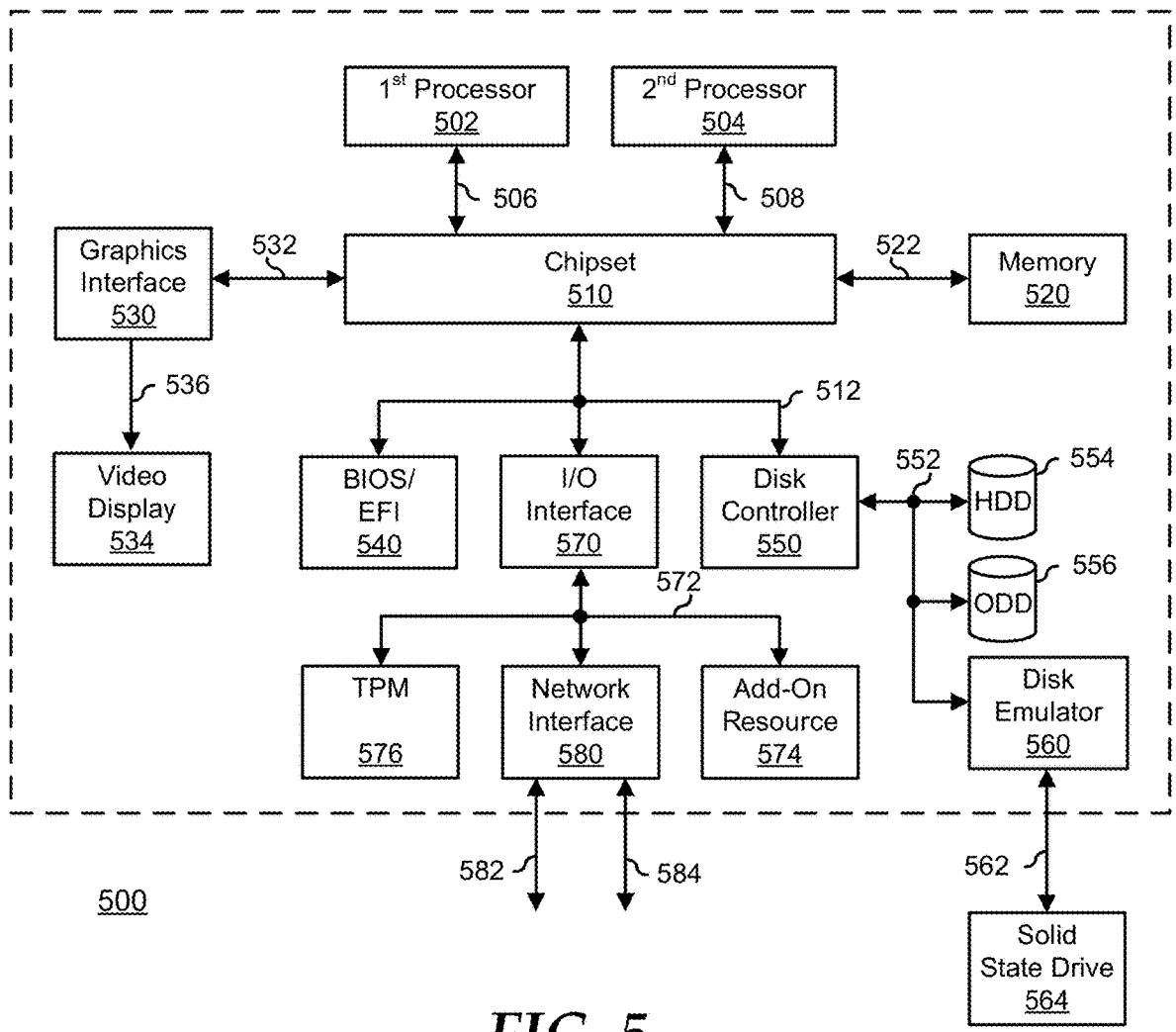
FIG. 5 is a block diagram illustrating a generalized information handling system according to an embodiment of the present disclosure.

FIG. 5 illustrates a generalized embodiment of an information handling system 500 similar to information handling system 100. For purpose of this disclosure information handling system 500 can be configured to provide the features and to perform the functions of the OPF system as described herein. Information handling system 500 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, a chipset 510, a memory 520, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an input/output (I/O) interface 570, one or more add-on resources 574, a trusted platform module (TPM) 576, a network interface 580, a management device 590, and a power supply 595. Processors 502 and 504, chipset 510, memory 520, graphics interface 530, BIOS/UEFI module 540, disk controller 550, HDD 554, ODD 556, disk emulator 560, SSD 562, I/O interface 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to chipset 510 via processor interface 506, and processor 504 is connected to the chipset via processor interface 508. Memory 520 is connected to chipset 510 via a memory bus 522. Graphics interface 530 is connected to chipset 510 via a graphics interface 532, and provides a video display output 536 to a video display 534. In a particular embodiment, information handling system 500 includes separate memories that are dedicated to each of processors 502 and 504 via separate memory interfaces. An example of memory 520 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O interface 570 are connected to chipset 510 via an I/O channel 512. An example of I/O channel 512 includes a Peripheral Component Interconnect (PCI) interface, a PCI-Extended (PCI-X) interface, a high speed PCI-Express (PCIe) interface, another industry standard or proprietary communication interface, or a combination thereof. Chipset 510 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O interface 570 includes a peripheral interface 572 that connects the I/O interface to add-on resource 574, to TPM 576, and to network interface 580. Peripheral interface 572 can be the same type of interface as I/O channel 512, or can be a different type of interface. As such, I/O interface 570 extends the capacity of I/O channel 512 when peripheral interface 572 and the I/O channel are of the same type, and the I/O interface translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as chipset 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 may include a commercially available BMC product that operates in accordance with an Intelligent Platform Management Initiative (IPMI) specification, such as a Integrated Dell Remote Access Controller (iDRAC), or the like. Management device 590 may further include associated memory devices, logic devices, security devices, or the like, as needed or desired.

Power supply 595 represents one or more devices for power distribution to the components of information handling system 500. In particular, power supply 595 can include a main power supply that receives power from an input power source, such as a wall power outlet, a power strip, a battery, or another power source, as needed or desired. Here, power source 595 operates to convert the power at a first voltage level from the input power source to one or more power rails that are utilized by the components of information handling system. Power supply 595 can also include one or more voltage regulators (VRs) that each receive power from the main power supply and that operate to convert the input voltage to an output voltage that is used by one or more components of information handling system. For example, a VR can be provided for each of processors 502 and 504, and another VR can be provided for memory 520. Power supply 595 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A dynamic random access memory (DRAM) device, comprising:
    an input to receive an on-die termination (ODT) signal and a WRITE signal; and
    ODT circuitry to terminate an interface circuit in a select one of a plurality of impedance levels, the interface circuit to provide a data signal between a memory controller and the DRAM device;
    wherein the DRAM device is configured to operate in a first impedance switching mode to:
        select a first impedance level in response to a first state of the ODT signal;
        select a second impedance level in response to a second state of the ODT signal and to a first state of the WRITE signal;
        select a third impedance level in response to the second state of the ODT and to a second state of the WRITE signal; and
        when the WRITE signal is in the second state and the ODT signal transitions from the second state to the first state, to transition from the third impedance level to the first impedance level within a predetermined amount of time, wherein in transitioning from the third impedance level to the first impedance level, the ODT controller is further configured to a)

terminate the interface circuit at a fourth impedance level at a particular time within the predetermined amount of time, and then b) terminate the interface circuit at the first impedance level, the fourth impedance level being between the first impedance level and the third impedance level, and wherein the particular time is selectable.

2. The DRAM device of claim 1, wherein the particular time is selected to be within a first half of the predetermined amount of time.

3. The DRAM device of claim 1, wherein the particular time is selected to be within a second half of the predetermined amount of time.

4. The DRAM device of claim 1, wherein the plurality of impedance levels are each provided by an associated one of a plurality of switched impedances.

5. The DRAM device of claim 4, wherein in terminating the interface circuit at the first impedance level, the ODT circuitry switches a first subset of the switched impedances into the interface circuit, in terminating the interface circuit at the second impedance level, the ODT circuitry switches a second subset of the switched impedances into the interface circuit, in terminating the interface circuit at the third impedance level, the ODT circuitry switches a third subset of the switched impedances into the interface circuit, and in terminating the interface circuit at the fourth impedance level, the ODT circuitry switches a fourth subset of the switched impedances into the interface circuit.

6. The DRAM device of claim 5, wherein in a second impedance switching mode, when the WRITE signal is in the second state and the ODT signal transitions from the second state to the first state, the DRAM device is further configured to direct the ODT circuitry to switch directly form the third impedance level to the first impedance level.

7. The DRAM device of claim 6, further comprising:
an error logger configured to detect an error in data transmissions on the interface circuit, wherein the DRAM device is further configured to switch the DRAM device from the second impedance switching mode to the first impedance switching mode in response to detecting the error in the data transmissions.

8. The DRAM device of claim 7, further comprising:
a timer that is set when the DRAM device switches from the second impedance switching mode to the first impedance switching mode, wherein the DRAM device is further configured to determine if an additional error in data transmissions on the interface circuit have occurred before the timer expires, and to switch the DRAM device from the first impedance switching mode to the second impedance switching mode in response to detecting no additional errors in data transmissions on the interface circuit before the timer has expired.

9. The DRAM device of claim 1, wherein the DRAM device is a fifth generation double-data rate (DDR5) DRAM device.

10. A method, comprising:
receiving, by a dynamic random access memory (DRAM) device, an on-die termination (ODT) signal and a WRITE signal;
setting the DRAM device into a first impedance switching mode;
directing ODT circuitry of the DRAM device to terminate an interface circuit that provides a data signal between s memory controller and the DRAM device at a first impedance level in response to a first state of the ODT signal;
directing the ODT circuitry to terminate the interface circuit at a second impedance level in response to a second state of the ODT signal and to a first state of the WRITE signal;
directing the ODT circuitry to terminate the interface circuit at a third impedance level in response to the second state of the ODT signal and to a second state of the WRITE signal; and
when the WRITE signal is in the second state and the ODT signal transitions from the second state to the first state, directing the ODT circuitry to transition from the third impedance level to the first impedance level within a predetermined amount of time, wherein in transitioning from the third impedance level to the first impedance level, the method further comprises:
directing the ODT circuitry to terminate the interface circuit at a fourth impedance level at a particular time within the predetermined amount of time; and
directing the ODT circuitry to terminate the interface circuit at the first impedance level, the fourth impedance level being between the first impedance level and the third impedance level, and wherein the particular time is selectable.

11. The method of claim 10, wherein the particular time is selected to be within a first half of the predetermined amount of time.

12. The method of claim 10, wherein the particular time is selected to be within a second half of the predetermined amount of time.

13. The method of claim 10, wherein the ODT circuitry comprises a plurality of switched impedances.

14. The method of claim 13, wherein:
in terminating the interface circuit at the first impedance level, the method further comprises switching a first subset of the switched impedances into the interface circuit;
in terminating the interface circuit at the second impedance level, the method further comprises switching a second subset of the switched impedances into the interface circuit;
in terminating the interface circuit at the third impedance level, the method further comprises switching, by the ODT circuitry, a third subset of the switched impedances into the interface circuit; and
in terminating the interface circuit at the fourth impedance level, the method further comprises switching a fourth subset of the switched impedances into the interface circuit.

15. The method of claim 14, further comprising:
setting the DRAM device into a second impedance switching mode; and
in response to setting the DRAM device into the second impedance switching mode, when the WRITE signal is in the second state and the ODT signal transitions from the second state to the first state, directing the ODT circuitry to switch directly form the third impedance level to the first impedance level.

16. The method of claim 15, wherein in further response to setting the DRAM device into the second impedance switching mode, the method further comprises:
detecting, by an error logger of the DRAM device, an error in data transmissions on the interface circuit; and
switching, by the DRAM device, the DRAM device from the second impedance switching mode to the first impedance switching mode in response to detecting the error in the data transmissions.

17. The method of claim 16, wherein in further response to setting the DRAM device into the second impedance switching mode, the method further comprises:
setting a timer of the DRAM device when the DRAM device switches from the second impedance switching mode to the first impedance switching mode;
determining if an additional error in data transmissions on the interface circuit have occurred before the timer expires; and
switching the DRAM device from the first impedance switching mode to the second impedance switching mode in response to detecting no additional errors in data transmissions on the interface circuit before the timer has expired.

18. A dual in-line memory module (DIMM), comprising:
a first dynamic random access memory (DRAM) device; and
a second DRAM device including:
an on-die termination (ODT) controller including an input to receive an ODT signal and a WRITE signal from a memory controller; and
ODT circuitry to terminate an interface circuit, the interface circuit to provide a data signal between the memory controller and the first DRAM device;
wherein the ODT controller is configured to operate in a first impedance switching mode to direct the ODT circuitry to:
terminate the interface circuit at a first impedance level in response to a first state of the ODT signal;
terminate the interface circuit at a second impedance level in response to a second state of the ODT signal and to a first state of the WRITE signal;
terminate the interface circuit at a third impedance level in response to the second state of the ODT signal and to a second state of the WRITE signal; and
when the WRITE signal is in the second state and the ODT signal transitions from the second state to the first state, to transition from the third impedance level to the first impedance level within a predetermined amount of time, wherein in transitioning from the third impedance level to the first impedance level, the ODT controller is further configured to a) terminate the interface circuit at a fourth impedance level at a particular time within the predetermined amount of time, and then b) terminate the interface circuit at the first impedance level, the fourth impedance level being between the first impedance level and the third impedance level, and wherein the particular time is selectable.

19. The DIMM of claim 18, wherein the particular time is selected to be within a first half of the predetermined amount of time.

20. The DIMM of claim 18, wherein the particular time is selected to be within a second half of the predetermined amount of time.

* * * * *